United States Patent
Reichart et al.

(10) Patent No.: US 9,711,388 B2
(45) Date of Patent: Jul. 18, 2017

(54) SUBSTRATE HOLDER AND A DEVICE AND A METHOD FOR TREATING SUBSTRATES

(71) Applicant: CENTROTHERM THERMAL SOLUTIONS GMBH & CO. KG, Blaubeuren (DE)

(72) Inventors: Johann Georg Reichart, Blaubeuren (DE); Wilhelm Kegel, Laichingen (DE); Günther Kummer, Ulm (DE); Reinhold Obst, Amstetten (DE); Wilfried Lerch, Dornstadt (DE)

(73) Assignee: Centrotherm Photovoltaics AG (DE)

( * ) Notice: Subject to any disclaimer, the term of this patent is extended or adjusted under 35 U.S.C. 154(b) by 0 days.

(21) Appl. No.: 14/441,524

(22) PCT Filed: Nov. 11, 2013

(86) PCT No.: PCT/EP2013/025004
§ 371 (c)(1),
(2) Date: May 8, 2015

(87) PCT Pub. No.: WO2014/072077
PCT Pub. Date: May 15, 2014

(65) Prior Publication Data
US 2015/0294893 A1    Oct. 15, 2015

(30) Foreign Application Priority Data

Nov. 9, 2012    (DE) .................. 10 2012 022 067

(51) Int. Cl.
*H01L 21/31* (2006.01)
*H01L 21/469* (2006.01)
(Continued)

(52) U.S. Cl.
CPC ........ *H01L 21/6838* (2013.01); *C23C 16/458* (2013.01); *C23C 16/45544* (2013.01);
(Continued)

(58) Field of Classification Search
CPC .......... H01L 21/6838; H01L 21/02271; H01L 21/0262; H01L 21/6875; H01L 21/68742;
(Continued)

(56) References Cited

U.S. PATENT DOCUMENTS

| 5,096,536 A | 3/1992 | Cathey, Jr. |
| 6,394,797 B1 | 5/2002 | Sugaya et al. |

(Continued)

FOREIGN PATENT DOCUMENTS

| DE | 102008022784 | 11/2009 |
| EP | 0803904 | 10/1997 |
| WO | 02/065510 | 8/2002 |

*Primary Examiner* — Stephen W Smoot
*Assistant Examiner* — Vicki B Booker
(74) *Attorney, Agent, or Firm* — Tarolli, Sundheim, Covell & Tummino LLP (57) ABSTRACT

A substrate holder having a plate element for receiving a substrate includes at least one recess in a first side and spacers in the at least one recess. At least one opening is fluidly connected to the recess and is connectable to an external gas delivery/exhaust unit. At least one notch or channel radially surrounds the recess. At least one opening is fluidly connected to the notch or channel and is connectable to an external gas delivery/exhaust unit. A circumferential web radially surrounds the recess and is located between the recess and the notch or channel. A first circumferential contact surface is formed on the upper side of the web and radially surrounds the recess, such that a substrate abutting against the first contact surface forms an enclosed chamber with the recess. A second circumferential contact surface radially surrounds the notch or channel.

18 Claims, 4 Drawing Sheets

(51) Int. Cl.
| | |
|---|---|
| *H01L 21/683* | (2006.01) |
| *H01L 21/67* | (2006.01) |
| *H01L 21/687* | (2006.01) |
| *C23C 16/455* | (2006.01) |
| *C23C 16/458* | (2006.01) |
| *C23C 16/48* | (2006.01) |
| *C23C 16/50* | (2006.01) |
| *H01L 21/02* | (2006.01) |

(52) U.S. Cl.
CPC ............. *C23C 16/48* (2013.01); *C23C 16/50* (2013.01); *H01L 21/0262* (2013.01); *H01L 21/02271* (2013.01); *H01L 21/67115* (2013.01); *H01L 21/6875* (2013.01); *H01L 21/68742* (2013.01)

(58) Field of Classification Search
CPC ............. H01L 21/67115; C23C 16/458; C23C 16/45544; C23C 16/50; C23C 16/48
See application file for complete search history.

(56) References Cited

U.S. PATENT DOCUMENTS

| | | |
|---|---|---|
| 2004/0218339 A1 | 11/2004 | Nakamura |
| 2009/0250855 A1 | 10/2009 | Fuji et al. |
| 2010/0119337 A1 | 5/2010 | Wallmueller |
| 2011/0117693 A1 | 5/2011 | Palm et al. |

Fig. 4

SUBSTRATE HOLDER AND A DEVICE AND A METHOD FOR TREATING SUBSTRATES

RELATED APPLICATIONS

This application corresponds to PCT/EP2013/025004, filed Nov. 11, 2013, which claims the benefit of German Application No. 10 2012 022 067.7, filed Nov. 9, 2012. The subject matter of these applications is, of which are incorporated herein by reference in its entirety.

BACKGROUND OF THE INVENTION

The present invention relates to a substrate holder and in particular to a substrate holder for holding a substrate by means of a vacuum, as well as to an apparatus and a method for the treatment, in particular a thermal treatment of substrates, in particular semiconductor substrates.

In the art different apparatuses for the thermal treatment of substrates are known, as well as different devices for holding the substrate in a process chamber of an apparatus for thermal treatment of the substrate.

A known apparatus for the thermal treatment of semiconductor wavers, for example provides for heating the waver by means of electromagnetic radiation, which is emitted by lamps, for example tungsten halogen lamps.

Such apparatuses are typically called RTF-units (RTP=rapid thermal processing) or rapid healing units, as they allow rapid changes in temperature. Typically a waver receptacle is provided in the process chamber of the rapid heating unit, on which the waver is supported during the thermal treatment. Supports are known, which are in substance transparent, to the electromagnetic radiation of the lamps as well as supports, which are opaque to the electromagnetic radiation of the lamps. The first mentioned supports are supposed to allow direct heating of the waver by means of the electromagnetic radiation of the temps. The latter supports however are provided to allow heating of the support by means of the electromagnetic radiation of the lamps and thus only indirectly heating the wavers by means of heating the support. In both types of support, the waver typically freely rests on the support and it is not possible to apply a force to the waver.

SUMMARY OF THE INVENTION

It is an object of the invention to provide a device, which is capable of applying a force to a substrate which is at least partially made of a semiconductor material, in order to securely hold the substrate during a treatment thereof and to optionally deform the same.

In accordance with the invention, this object is solved by a substrate holder having a plate element in accordance with claim 1 and by an apparatus and a method for the treatment of substrates in accordance with claims 14 and 16, respectively. Further embodiments of the invention are inter-alia disclosed in the respective dependent claims and the specification.

In particular, the plate element comprises: at least one recess in a first side of the plate element, a plurality of spacers in the at least one recess, at least one opening fluidly connected to the recess and capable of being connected to an external gas delivery/suction unit at least notch or channel, which radially surrounds the recess, at least one opening, which is fluidly connected to the notch or channel and which is capable of being connected to a gas-delivery/suction unit, one circumferential web, which surrounds the recess radially and is arranged between the recess and the notch or channel, and circumferential contact surfaces for the substrate, wherein a first circumferential contact surface is formed on the upper surface of the web and which surrounds the recess radially, such that a substrate contacting the first contact surface forms a closed chamber together with the recess, and a second circumferential contact surface, which surrounds the notch or channel radially.

Such a substrate holder allows in an easy manner to apply different gas atmospheres to opposite sides of a substrate during a treatment thereof. These may for example differ with respect to the pressure, the gases and or the composition of mixtures of gases. The spacers may prevent excessive deformation into the direction of the recess if there is a pressure difference between the two sides. In particular, it is possible to suck the substrate to the plate element via the notch or channel in order to provide a secure hold of the substrate.

This increases the flexibility with respect to the choice of the gas atmosphere in the area of the recess.

Preferably, the first circumferential contact surface, the notch or channel and a portion of the second contact surface have a combined width of ≤5 mm, preferably of ≤3 mm, corresponding to a common edge exclusion width of semiconductor wafers. Hereby it is possible to contact the substrate in substance only in the area at the edge, wherein the shape and dimensions of the substrate holder are adapted to the shape and dimensions of the substrate. In particular, it should be achieved that the substrate is contacted only at its edge exclusion area. The skilled person will realise, that the maximum shared width of the first circumferential contact surface, of the notch or channel and the portion of the second contact surface are given by the substrate and may be larger or smeller than the dimensions given above. The notch or channel may be segmented into different sections by means of webs, wherein for each portion at least one opening is formed in the plate element.

Preferably, the recess comprises a circumferential shape corresponding to the circumferential shape of a substrate to be received, wherein the circumferential dimensions of the recess are smaller than the circumferential dimensions of a substrate to be received, such that a substrate received on the substrate holder may circumferentially contact the contact surfaces at its edge. Hereby, a process area may be defined in the area of the recess, which substantially covers the complete surface of the substrate with the exception of an edge portion thereof.

In one embodiment, the spacers have a height, such that their upper surfaces are arranged underneath the circumferential contact surface, such that a flat substrate contacting the contact surface would not contact the spacers. Hereby it can be achieved that a gas in the recess may contact the complete surface of the substrate received on the substrate holder in the process area.

In order to provide a desired support of the substrate, in case a negative pressure or vacuum exists in the recess, the distance between the spacers may be smeller than structures formed on the side of the substrate to be received facing the substrate holder. In so doing, support for each structure can be ensured.

In a preferred embodiment, the plate element comprises at least a further recess on the first side, the bottom of which forms the second contact surface, such that a raised edge portion is formed circumferentially with respect to the second contact surface. Such an edge portion may at least partially compensate for edge effects during a thermal treatment of substrates, by at least partially surrounding a substrate received on the substrate holder in a radial manner. In particular, the further recess may have a circumferential shape, which corresponds to the circumferential shape of a substrate to be received, wherein the circumferential dimensions of the further recess are larger than the circumferential dimensions of a substrate to be received, such that it is at least partially receivable in the further recess. The further recess may have a height which is larger or equal to the heights of a substrate to be received.

In addition to the one plate element, the substrate holder may comprise a further plate element, which may be brought into contact with the first side of the plate element in such a manner that a chamber for completely receiving the substrate to be treated is formed between the further plate element and the plate element in the area of the further recess.

In particular for the use with semiconductor substrates, at least one plate element may be made of at least one of the following: graphite, silicon carbide, ceramics, $Al_2O_3$, bore nitride and highly doped silicon. Such materials pose no danger of undesired contaminations for most semiconductor processes but also for other processes. Furthermore, they have a high thermal and/or chemical stability with respect to many processes. As an alternative material, quartz glass may be used for similar reasons, wherein quartz glass for example is substantially transparent to the lamp radiation in thermal processes using lamp radiation.

In one embodiment, the plate element has a plurality of through openings in the area of the contact surface or in the area of the webs, which are suitable for passing pins for raising/lowering a substrate there through. This enables easy loading and unloading of substrates. The specific location of the through openings prohibits a negative influence on a gas atmosphere or vacuum in the area of the recess or in the area of the notch or channel. Preferably, at least three through openings should be provided for a respective number of pins, in order to provide safe support of the substrate during the lifting or lowering of the substrate.

The apparatus for the treatment of substrates, in particular of semiconductor substrates comprises at least one process chamber for receiving the substrate, at least one substrate holder of the above type, which is arranged in the process chamber or may be arranged therein, and at least one radiation source, which is arranged to emit radiation into the process chamber. Such an apparatus is suitable for different processes and due to the substrate holder, different treatments may be simultaneously provided on opposite sides of the substrate. In particular, the at least one radiation source may be arranges such that it emits radiation in the direction of the substrate holder. The substrate holder may absorb the radiation and pass the respective energy thereof on to the substrate in a different form.

The method for the treatment of substrates comprises the following steps: sucking a first side of the substrate towards the substrate holder in a suction area which radially surrounds a first process area on the first side of the substrate such that the suction area and the process area are separated, applying a first gas atmosphere to a second side of the substrate and applying a second gas atmosphere in the first process area to the first side of the substrate for a treatment of the substrate, wherein the first and second gas atmosphere are different from each other. The different gas atmosphere enabled during a single process achieving different surface treatments on the first and second sides of the substrate. The first and second gas atmosphere may preferably differ with respect to at least one of the following: the applied pressures, the gases and the composition of mixtures of gases. In particular, a vacuum may be applied to the first side of the substrate, which may enable at least one sided vacuum treatment of the substrate in, for example, a unit which is otherwise not suitable for a vacuum or at least a negative pressure of the applied magnitude. In other words, in the area of the first process a vacuum may be set higher than in the rest of the unit.

BRIEF DESCRIPTION OF THE DRAWINGS

The invention will be described in more detail herein below with respect to the drawings. In the drawings.

DESCRIPTION OF EMBODIMENT

In the following description terms such as above, below, left and right and similar terms relate to the drawings and are not to be seen in a limited manner, even though they relate to a preferred embodiment. The term "substantially" used with respect to angles and arrangements is supposed to encompass deviations up to 10°, preferably up to 5° unless otherwise stated.

Figure 1:
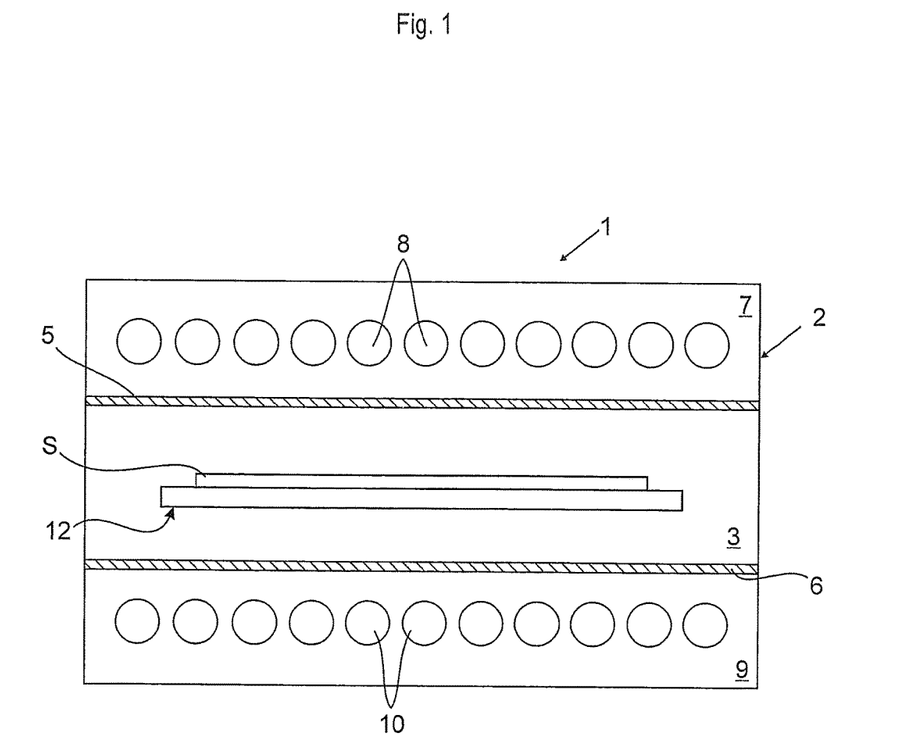
FIG. 1 shows a schematic side-sectional view of an apparatus for the thermal treatment of semiconductor wafers.

FIG. 1 shows a schematic side sectional view of an apparatus 1 for the thermal treatment of substrates S. Even though the apparatus may generally be used for any type of substrate, it is particularly suited for flat substrates S (optionally made of several layers), which comprises at least partial areas of a semiconductor material, in particular silicon. Other partial areas may for example consist of a different material, in particular a material which may be deformed at high temperatures. The substrate S may have a predetermined distribution of the different partial areas.

The apparatus 1 comprises a housing 2, having an inner space which inter alia forms a process chamber 3. The process chamber 3 is confined on its top and bottom by wall elements 5 and 6, respectively, and laterally by the housing 2. Above the wall member 5, a lamp chamber 7 is provided in the housing 2, which lamp chamber may be mirrored, and in which a heat source in the shape of several lamps 8 is provided. Below the wall element 6 also a lamp chamber 9, similar to chamber 7, is provided in which a heat source in the form of several lamps is provided.

The side walls of the process chamber 3 may also have a certain mirror effect for at least a portion of the electromagnetic radiation which is present in the process chamber 3. Furthermore, at least one of the side walls of the process chamber 3 comprises a process chamber door (not shown), in order to allow introduction and removal of the substrate S. Furthermore, not shown gas inlets and gas outlets (not shown) for the process chamber may be provided.

A substrate holder 12 is provided in the process chamber 3, which substrate holder is also referred to as a suction unit. The substrate holder 12 extends in substance parallel to the wall elements 5, 6 and is arranged approximately in the middle between the same. The substrate holder 12 serves for receiving and holding the substrate S by suction. The structure of the substrate holder or suction unit 12 will be described herein below with reference to FIGS. 2 to 5 or 6 and 7.

The wall elements 5 and 6 which confine the process chamber 3 above and below are each made of a material, which is in substance transparent to the radiation of the lamps 8, 10, such as for example, quartz. As the lamps 8, 10, for example tungsten halogen lamps, which are often used in wrapping heating units, may be used. It is also possible to use other lamp types, such as flash lamps. These lamps may also be arranged in a different manner to the manner as shown and it is also possible to combine the different lamp types or to combine the lamp types with other lamp types or replace the same by other lamp types. In particular it is also possible to dispense with the upper or the lower lamp chamber 7, 9 and thus the respective lamps 8, 10 and to provide only one of the lamp chambers.

Figure 2:
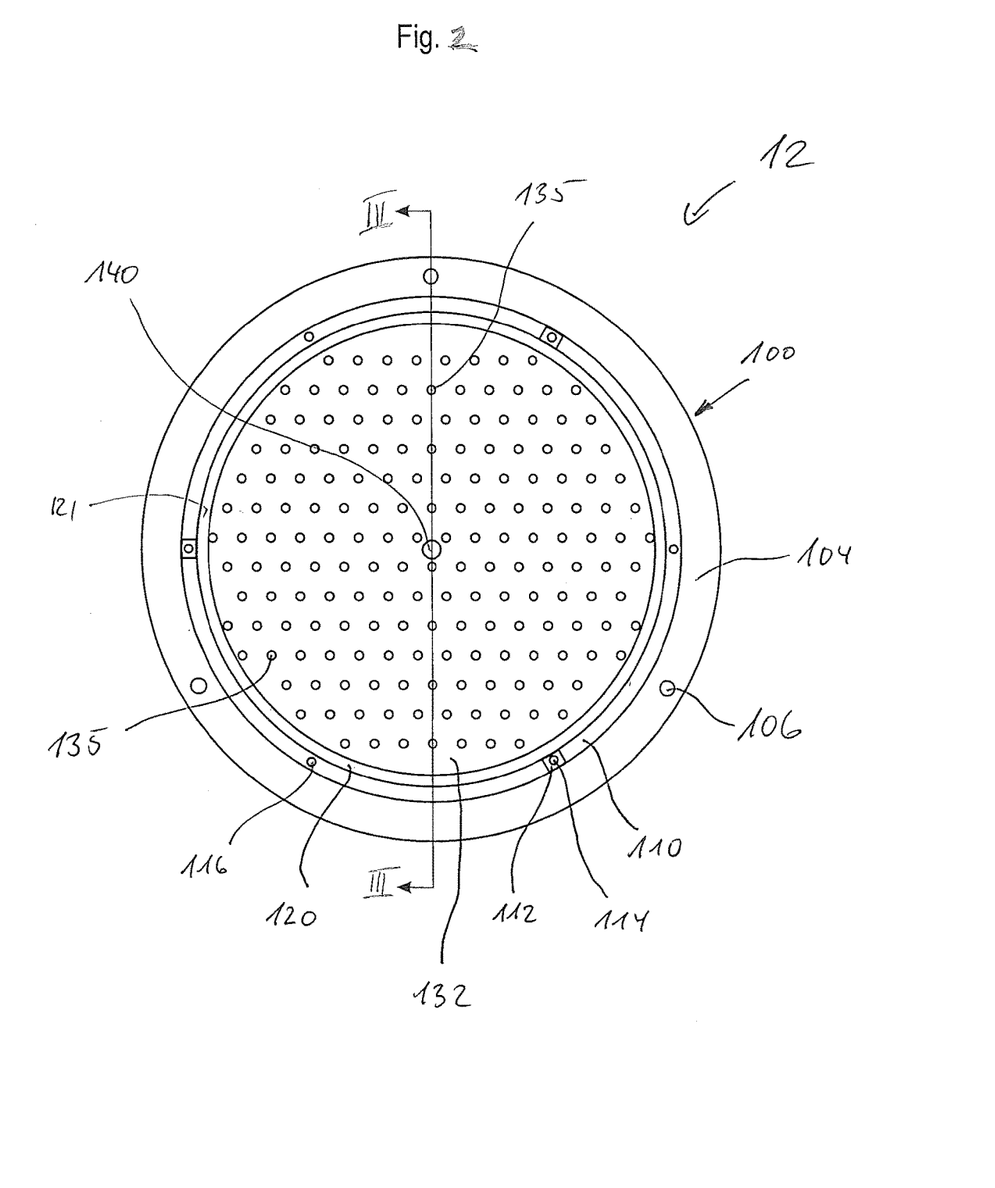
FIG. 2 shows a schematic top view on a suction unit, which is suitable for use in the apparatus according to FIG. 1.
Figure 3:
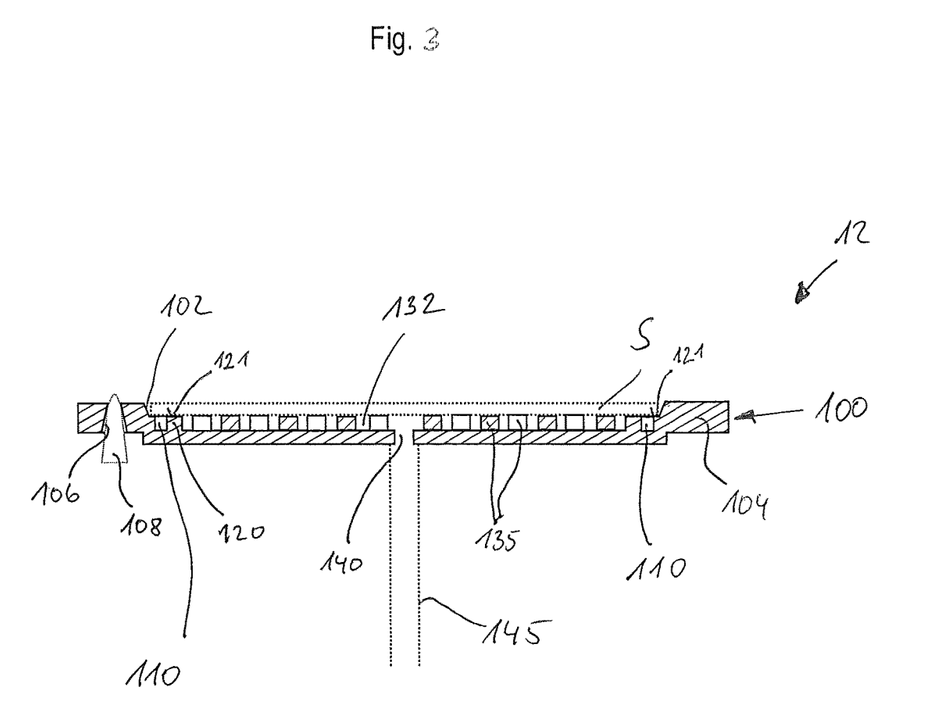
FIG. 3 is a schematic cross-sectional view of the suction unit of FIG. 2 along the line III-III.

With reference to FIGS. 2 and 3 a first embodiment of the suction unit 12 is explained in more detail. In this embodiment a single plate element 100 is provided. This plate element 100 is shown in a top view according to FIG. 2 and in a sectional view according to FIG. 3 along the line III-III in FIG. 2.

The plate element 100 is made of a suitable material, which does not emit contaminations to a substrate to be treated while it is held by the suction unit 12. For the use with semiconductor substrates in a thermal treatment chamber material for the plate element 100, such as graphite, silicon carbide (SiC), ceramics, $Al_2O_3$, (sapphire, alsint, etc.), bore nitride and similar materials are taken into consideration. If sufficient rigidity or stability can be achieved, also a semiconductor material in particular one having a high dopant concentration, or opaque quartz glass may be used. These materials have in common, that they in substance absorb the lamp radiation which is emitted by the lamps during operation, are heated thereby and then themselves emit heat radiation and may thus act as a so called suceptor. Alternatively, it is also possible that the plate material is made of a material which is in substance transparent to the lamp radiation, such as, for example, transparent quartz glass, in order to enable a substantially direct heating of the substrate by means of lamp radiation. Also mixtures of these materials are possible. For example, a SiC base material having a coating made of a semiconductor material, on the surfaces which contact the substrate S is possible. Also, the materials may be provided with coatings. In particular, a pyrolytic coating of graphite is taken into consideration in order to reduce the surface roughness.

The plate element 100 has a round circumferential shape, as is shown in the top view according to FIG. 2. As seen from above, the plate element 100 has a first recess 102, which is concentric to the outer circumference and which in substance defines a receiving space for a substrate S, as is schematically shown in FIG. 3. The first recess 102 has a round shape and is thus adapted to the circumferential shape of the substrate S. The first recess 102 is furthermore concentric to the outer circumference of the plate element 100. If a different substrate shape is used, the recess 102 may be matched correspondingly. The edge area of the recess 102 has conically widening form towards the top as is indicated in FIG. 3. This conical broadening allows centering of a substrate S while it is received in the first recess 102. The heights of the recess 102 may correspond in substance to the heights of the substrate S to be received.

By means of the first recess 102 a raised edge area 104 is formed. This raised edge area 104, which radially surrounds a substrate S which is received in the first recess 102 may provide a thermal balancing function during the thermal treatment of a substrate S, in order to reduce edge effects during a heating/cooling of the substrate S, as is known in the art. Within the edge area 104 optional through openings 106 may be provided which conically broaden towards the bottom, for receiving conic receiving pins 108 (one of which is schematically shown).

These may serve to receive the plate element 100 either within or outside of the process chamber and to securely hold the same in an aligned position.

At the bottom of the first recess 102, a substantially flat contact surface 121 is formed. In this contact surface, a substantially circumferential notch or channel 110 is formed which has a small distance to the inclined side wall of the first recess 102 (for example, at a distance of 1 to 2 mm) and is concentric to the outer circumference. As is shown in the top view according to FIG. 2, the notch 110 may be separated in two separate sections (three) by a plurality of webs 112 (three of which are shown). Through openings 114 may be formed through the webs 112 through which pins (not shown) may extend for lifting/lowering a substrate S from/towards the plate element 100. Within the separated segments of the notch 110 further openings 116 may be provided, which may be connected to gas-delivery/suction units (not shown), in particular a vacuum source. In order to allow sucking the edge of a substrate S received in the first recess 102 towards the substrate holder. The openings 116 may be connected to a vacuum source in any suitable manner.

A circumferential web 120 is provided radially inside with respect to the notch 110, which is concentric to the notch 110 and which forms a portion of the contact surface 121 for the substrate S on the upper side thereof. Radially within the circumferential web 120 a second recess 132 is formed which extends deeper into the plate element 100 than the first recess 102. The web surrounds the second recess completely and does not comprise a connection between the second recess 132 and the notch 110.

A plurality of spacers 135 is formed in the second recess 132. These spacers are preferably integrally formed with the plate element 100 and may for example be formed by etching, milling etc. They can also be formed as separate elements, for example as a continuous insert having a common base from which the spacers 135 extend upwards. Such an insert would allow a quick replacement for changing at least one of the distribution, the size and the number of spaces for different requirements. However, it is preferred to integrally form the spacers 135 with the plate element 100. The shape, size and number of spacers 135 are only schematically shown in the figures. In particular, the number of spacers 135 may be substantially higher than the number shown. Preferably a sufficient number of spacers 135 is provided, which enables the distances between adjacent spacers 135 to be smaller than structures formed on a substrate S to be treated. Instead of the round shape as shown in the top view, the spacers 135 may also have a different, in particular an angular shape, which may potentially facilitate manufacture thereof. In practice a substantially larger number of spacers 135 is provided as shown in the drawings as will be realized by the skilled person. These spaces will typically have a uniform distribution within the recess 132.

In the representation of FIG. 3, the spacers 135 have the same heights as the circumferential web 120. It is, however, also possible to provide the spacers 135 with lower heights, such that a substrate S, when it is received on the plate element 100 within the first recess 102, securely contacts the upper side of the web 120 in a circumferential manner. A small gap of, for example, 0.1-0.5 mm, could thus be formed between the spacers 135 and a lower surface of the substrate S in a state of rest (the substrates is flat).

A through opening 140 is formed through the bottom of the plate element 100 concentric within the second recess 132. This opening 140 is centrally and concentrically arranged with respect to the outer circumference of the plate element 100. The opening 140 is shown as a single opening, which is located between the spacers 135. With a higher number of spacers 135, the space between the spacers may not be sufficient to provide a single opening 140 having a sufficient flow capacity. Rather than leaving out spacers 135 in the area of the opening, in order to provide sufficient space for a larger opening, it would be preferred to provide a plurality of openings between the spacers, for example in the shape of long holes, which may extend between rows and columns of spacers. These may in sum provide a sufficient flow capacity without influencing the distribution of the spacers 135. Furthermore, the opening 140 does not have to be centrally located. The opening ore plurality of openings could be provided at any suitable position in the bottom (or even in a side wall) of the recess 132.

As is indicated in FIG. 3, the opening 140 may be fluidly connected to a conduit 145. Such a conduit 145 may for example be provided in the area of the process chamber 3 of a rapid heating unit 1, as is shown in FIG. 1. The conduit 145 should preferably be made of an opaque material, such as opaque quartz glass, in order to prohibit a substantially unrestricted passage of lamp radiation through the opening 140. In case the plate element is also of an opaque material. The conduit 145 may also be of any other suitable material, such as graphite or silicon carbide or a transparent material. Mixtures of these materials are also taken into consideration, in particular mixtures of transparent and opaque materials. The conduit 145 may optionally be provided with additional elements, such as arms formed thereon, which may for example extend from the conduit 145 and which act as a support for the plate element 100 in the rapid heating unit.

In case the conduit 145 is provided with a rotating mechanism, the plate element 100 may be received in the rapid heating unit 100 in a rotatable manner. Arms extending from the conduit 146 may for example be aligned with the openings 116 in the notch 110 of the plate element 100 (or with other openings which are connected to the recess 132) and may provide a fluid connection to the conduit 145. In such a case a common evacuation of the second recess 132 and the notch 110 may be provided. It is also possible to provide separate evacuation of these areas by providing suitable mechanisms such as, for example the arrangement of two concentric conduits 145. In such a case, an inner conduit may be fluidly connected to the opening(s) 140 and an outer conduit may for example be fluidly connected to the openings 116 via respective arms.

Such a separate evacuation is for example particularly advantageous in cases where a holding force is supposed to be applied to the substrate S via the notch 110, while via the opening(s) 140 a specific process atmosphere is to be set in the second recess 132. This may for example also encompass evacuation of the space between the plate element 100 and the substrate S in the area of the second recess 132. In this case the spacers 135 would prohibit an excessive bending of the substrate S into the recess or may allow a specified deformation of partial areas of the substrate into areas between the spacers.

It is also possible to provide a specific gas of a desired concentration in this area. In particular when no negative pressure is applied to this area, the shorter spacers 135 would not contact the substrate and thus the whole surface of the substrate could be contacted by the gas in this area. When the spacers 135 are formed on an insert, it is also, possible to completely dispense with inserting the insert, in order to allow an even better gas distribution in the recess 132. When sucking the edge of the substrate to the substrate holder, for example, the following non-limiting process settings are possible:

passing a cooling fluid through the chamber formed between the substrate S and the plate element 100 (in the area of recess 132);

setting different gas atmospheres on the upper and lower sides of the substrate S, wherein the difference may inter alia be in at least one of the following: different gases, gas compositions, gas concentrations and so on;

generating a pressure differential between the upper and lower side of the substrate, etc.

The backside of the plate element 100 is recessed in the edge area 104 and forms a shoulder. This recess may provide different functions. For example, a more homogeneous thermal capacity may be provided over the plate element 100.

In the following, use of a suction unit 12 in a rapid heating unit 1 may be explained in more detail.

Initially it is assumed that the plate element 100 with the substrate S resting thereon are handled as a unit into the rapid heating unit 1 and out of the same. It is alternatively also possible to provide the plate element 100 of suction unit 12 for example permanently or as a replacement part, i.e. semi-permanent, inside the rapid heating unit 1 and to only convey the substrate S for a treatment into and out of the rapid heating unit 1.

In either case, first the substrate S is introduced into the first recess 102. For this purpose, for example pins (not shown) may extend through openings 114 above the plate element 100 in order to form a reception plane. The substrate may be placed onto the pins, which are subsequently lowered, in order to bring the substrate S into the area of the first recess 102, until the substrate S rests on the circumferential web 120 and contact surface 121, respectively.

Of course, the pins could also be stationary and a respective effect may be achieved by moving the plate element 100.

Subsequently, the plate element 100 together with the substrate S is moved into the rapid heating unit 1, such that a conduit 145 inside the rapid heating unit 1 is fluidly connected to the opening 140, and further conduits (not shown), which are for example formed as arms on the conduit 145, are fluidly connected to the openings 116.

Then, the notch or channel 110 is evacuated via the openings 116 in order fixedly suck the substrate S against the plate element 100.

The rapid heating unit 1 is closed at this time or is being closed, and a thermal treatment of the substrate S may be performed inside the rapid heating unit 1.

Via a respective control of the conduit 145, a desired process atmosphere may be adjusted in the area of the second recess 132 between the substrate S and the plate element 100. In particular, it is possible to provide a different process gas atmosphere on the lower side of the substrate S, compared to the free upper side of the substrate S. It is for example possible to apply a vacuum to the lower side of the substrate S via the opening 140 of the plate element 100, while above the substrate S a different suitable process atmosphere is provided. The suction unit 12 thus in particular allows vacuum processing of one side of the substrate in an otherwise atmospheric rapid heating unit. Obviously it can also be advantageous in a sub-atmospheric unit, in order to provide pressure differences and in particular to provide a higher vacuum at the lower side compared to a vacuum which may be achieved by the sub-atmospheric unit alone.

Rather than applying a vacuum to the lower side of the substrate S it is also possible to provide a different process gas atmosphere. In particular a different than the one provided on the upper side of the substrate S. Thus, the upper and lower sides of the substrate S may be processed differently, in particular, when the spacers 135 do not contact the substrate S, which would be the case if a vacuum were applied to the second recess 132, it is possible that the substrate S is substantially fully contacted with a desired gas in the area of the second recess 132. For such processing, it would also be possible to dispense with the spacers 135. In the recess, gases may be used which are typically not used in the rapid heating unit 1, for example due to the danger of contaminations. Within the recess 132 a separate atmosphere may be set which differs from the general atmosphere in the rapid heating unit 1. If gases from the recess 132 are leaking, these gases would first come into the area of the notch or channel 110 and would be exhausted there from, such that it may be prevented that the gases come into the process chamber of the rapid heating unit 1.

Due to the central location of the conduit 145 it is also possible to easily connect the plate element 100 with a rotating mechanism, in order to allow horizontally rotating the substrate S during the thermal treatment thereof.

As is clear from the above description, a suction unit 12 according to this embodiment allows different types of treatments for a substrate received thereon, such as a vacuum treatment on one surface within an otherwise atmospheric rapid heating unit.

Figure 4:
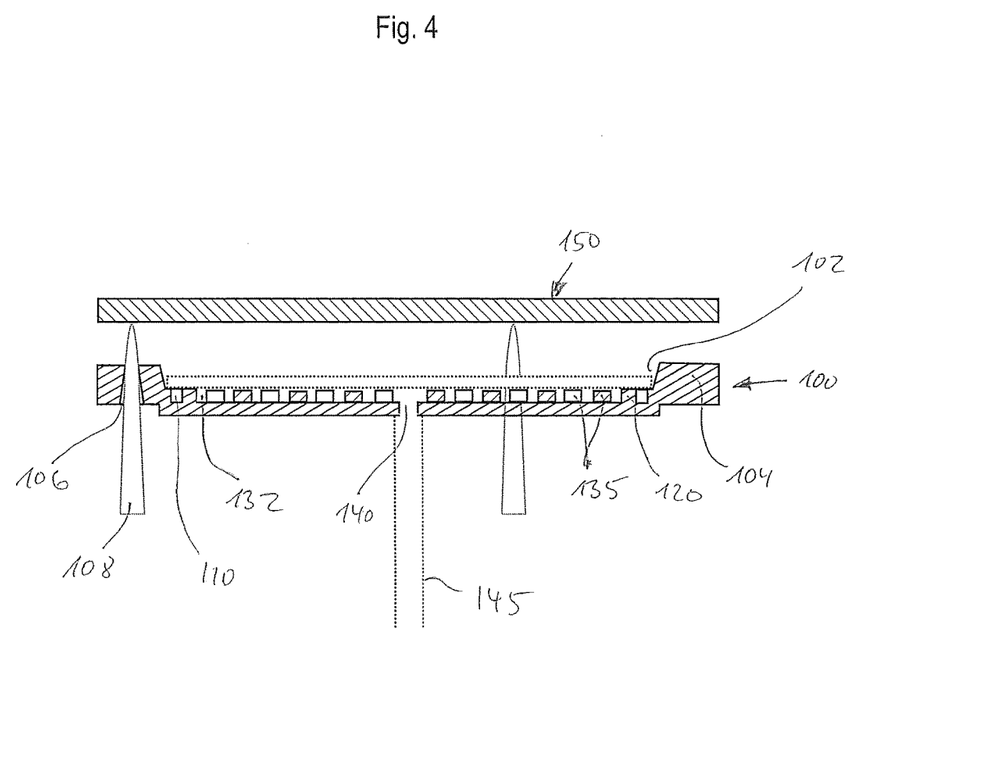
FIG. 4 is a schematic cross-sectional view of an alternative suction unit.

With reference to FIG. 4, a further embodiment of the suction unit 12 will be explained in more detail herein below. The suction unit is substantially constructed in the same manner as the previously described one and the same reference signs are used. Therefore, in the following, only the differences are indicated and a more detailed description will not be given in order to avoid repetition. The suction unit 12 again has a plate element 100, having a first recess 102, which forms a raised edge area 104. This edge area 104 is higher than the one in the first embodiment, in order to allow a substrate S to be completely received therein.

This is required here, since the plate element cooperates with a second plate element, which is named as cover 160 in the following, to form a closed chamber for receiving the substrate S. Such a cover may in particular be made of a material absorbing lamp radiation, which would provide for heating the cover 150 during a thermal treatment and only indirectly heating the substrate S via the cover 150. In the cover 150 and/or the plate element 100 gas inlets and/or gas outlets may be provided in order to provide a desired gas atmosphere in the chamber provided there between. The substrate could thus be received in an substantially closed chamber having a desired gas atmosphere. In the representation according to FIG. 4 the cover 150 is shown as a flat plate, which has circumferential dimensions corresponding to the ones of the plate element 100. In the representation the cover 150 rests on conical pins 108, which extend through opening 106 in the edge area 104 of the plate element. As is shown in the lowered condition (resting on the plate element 100) the cover would form together with plate element 100 a chamber for receiving the substrate S. Instead of providing a raised edge area 104 it is obviously also possible to leave the edge area unchanged with respect to the first embodiment and to instead provide a recess in the underside of the cover 150, in order to allow a sufficient chamber formation between the plate element 100 and the cover 150 for receiving a substrate S. The cover 150 may simply rest on the plate element 100 by gravity or it may be secured plate element 100 by at least one of the following: mechanically, a vacuum and other means. Such an additional fixing, in particular in combination with a seal may allow process atmospheres in the area of the chamber, which do not come into contact with the other atmosphere in the process chamber. In particular, process atmospheres may be used, which could potentially contaminate the process chamber. Thus, the suction unit 12 enables using certain processes in process units, in which these processes were previously net possible due to the danger of contaminations, because the process chamber is protected from the actual process space within the suction unit 12.

The plate element 100 again comprises a second recess 132 with spaces 135 therein, which in this representation, however, has such a height that in a rest position, a flat substrate would only rest on the contact surface 121 and would not contact the substrate holders 135.

Operation of the suction unit 12 according to FIG. 4 is substantially the same as previously described, wherein, however, for a treatment of the substrate S the cover 150 may be placed on the lower plate element 100.

Again, above and below the substrate S again at least one of the following may be set: different gas atmospheres and different pressures.

The invention was described with respect to certain embodiments of the invention without being limited to the specific embodiments. In the embodiment as shown, the notch 110 of the plate element 100 is for example segmented by webs 112, in order to allow for providing the through openings 114 there through for passing pins for lifting/lowering of substrates. Alternatively, it is also possible to provide the notch or channel 110 as a circumferential notch or channel, i.e. without segmentation. In such a case, respective through openings for pins could for example be provided in the area of the web 120 or at a different location of the contact surface 121, or a totally different mechanism for loading and unloading of the substrate S could be provided. Even though the plate element 10 in the embodiments as shown has a round circumferential shape, which is particularly suited for round substrates and a rotation of the same, the plate element could obviously have other shapes.

Furthermore, the suction unit 12 was specifically described in combination with a rapid heating unit. The suction unit 12 however, is not only limited to a use in a rapid heating unit. For example the suction unit 12 could also be used in other fields, i.e. outside of an apparatus for the thermal treatment of substrates. In particular, it could also be advantageously used in a plasma treatment device, a chemical vapour deposition device, which may be plasma enhanced or not (PECVD/GVD), or in an atomic layer deposition device (ALD). The materials used for the plate element(s) could be chosen such that the substrate to be treated and the process are not negatively influenced or contaminated. The features of the different embodiments may be freely combined and/or replaced as long as they are compatible.

The invention claimed is:

1. A substrate holder (12) having a plate element (100) for receiving a substrate (S), wherein the plate element (100) comprises:

at least one recess (132) in a first side of the plate element (100), a plurality of spacers (135) in the at least one recess (132), at least one opening (140), which is fluidly connected to the recess (132) and is connectable to an external gas delivery/exhaust unit, at least one notch or channel (110), which radially surrounds the recess (132), at least one opening (116), which is fluidly connected to the notch or channel (110) and is connectable to an external gas delivery/exhaust unit, a circumferential web (120), which radially surrounds the recess (132) and is located between the recess (132) and the notch or channel (110), and circumferential contact surfaces (121) for the substrate, wherein a first circumferential contact surface is formed on the upper side of the web (120) and radially surrounds the recess (132), such that a substrate contacting the contact surface (121) forms a closed chamber together with the recess, and a second circumferential contact surface (121) which radially surrounds the notch or channel, wherein the spacers (135) have heights such that their upper sides are located below the circumferential contact surfaces 121 such that a flat substrate (S) abutting the contact surface (121) would not contact the spacers (135).

2. The substrate holder (12) of claim 1, wherein the first circumferential contact surface (121), the notch (110) and a partial area of the second contact surface in combination have a width of ≤5 mm.

3. The substrate holder according to claim 1, wherein the notch or channel (110) is segmented by webs (112) into different section, wherein in each section at least one opening (116) is formed in the plate element (100).

4. The substrate holder according to claim 1, wherein the recess (132) comprises a circumferential shape, corresponding to a circumferential shape of the substrate (S) to be received, and wherein the circumferential dimensions of the recess (132) are smaller than the circumferential dimensions of a substrate (S) to be received such that a substrate (S) received on the substrate holder may circumferentially abut against the contact surface (121) at its edge.

5. The substrate holder (12) according to claim 1, wherein the spacers (135) have a heights such that their upper sides are located 0.1 mm to 0.5 mm below the circumferential contact surfaces 121.

6. The substrate holder (12) according to claim 1, wherein the distance between the spacers (135) is smaller than structures on a side of the substrate (S) facing the substrate holder (12).

7. The substrate holder (12) according to claim 1, wherein the plate element (100) comprises at least one further recess (102) in the first side of the plate element (100), the bottom of which forms the second contact surface (121), such that a raised edge area (104) is formed circumferentially with respect to the second contact surface (121).

8. The substrate holder (12) according to claim 7, wherein the further recess (102) comprises a circumferential shape which correspond to a circumferential shape of a substrate (S) as to be received, wherein the circumferential dimensions of the further recess (102) are larger than the circumferential dimensions of a substrate (S) to be received, such that the substrate (S) is at least partially receivable in the further recess.

9. The substrate holder (12) according to claim 8, wherein the further recess (102) has a height which is higher or equal to the height of a substrate (S) to be received.

10. The substrate holder (12) according to claim 7, wherein the substrate holder (12) comprises a further plate element (150), which may be brought into contact with the first side of the plate element (100) in such a manner that a chamber is formed between the further plate element (150) and the plate element (100) in the area of the further recess (102) for completely receiving a substrate (S) to be treated.

11. The substrate holder (12) according to claim 10, wherein at least one of the plate elements (100, 150) is made of at least one of the following graphite, silicon carbide, ceramics, $Al_2O_3$, bornitride and highly doped silicon.

12. The substrate holder (12) according to claim 1, wherein at least one of the plate elements (100, 150) is made of quartz glass.

13. The substrate holder (12) according to claim 1, wherein the plate element comprises a plurality of through openings (114) in the area of the contact surface (121) or in the area of webs (112), wherein the through openings are suitable for passing pins there through for lifting/lowering a substrate.

14. An apparatus for the treatment of substrates, in particular semiconductor substrates, the apparatus comprising:
at least one process chamber for receiving the substrate (S);
at least one substrate holder (12) according to claim 1, wherein the substrate holder (12) is arranged within the process chamber or may be received therein; and
at least one radiation source, which is arranged to image radiation into the process chamber.

15. The apparatus of claim 14, wherein the at least one radiation source is arranged such that it emits the radiation into the direction of the substrate holder (12).

16. A method of the treatment of a substrate comprising:
sucking a first side of the substrate in a suction area, which radially surrounds a first process area on the first side of the substrate against a substrate holder such that the suction area and the first process area are separated;
applying a first gas atmosphere to a second side of the substrate; and
applying a second gas atmosphere in the first process area to the first side of the substrate, wherein the first and second gas atmosphere are different from each other and wherein the second gas atmosphere comprises a vacuum.

17. The method of claim 16, wherein the first and second gas atmosphere differ with respect to the applied pressures.

18. The method of claim 16, wherein the first and second gas atmosphere differ with respect to at least one of the gas and the composition of gas mixtures.

* * * * *